US011876365B2

(12) United States Patent
Handt

(10) Patent No.: US 11,876,365 B2
(45) Date of Patent: Jan. 16, 2024

(54) CONNECTING A LOAD TO A DIRECT CURRENT NETWORK

(71) Applicant: Siemens Aktiengesellschaft, Munich (DE)

(72) Inventor: Karsten Handt, Berg (DE)

(73) Assignee: Siemens Aktiengesellschaft, Munich (DE)

( * ) Notice: Subject to any disclaimer, the term of this patent is extended or adjusted under 35 U.S.C. 154(b) by 340 days.

(21) Appl. No.: 17/427,211

(22) PCT Filed: May 7, 2019

(86) PCT No.: PCT/EP2019/061668
§ 371 (c)(1),
(2) Date: Jul. 30, 2021

(87) PCT Pub. No.: WO2020/156688
PCT Pub. Date: Aug. 6, 2020

(65) Prior Publication Data
US 2022/0158437 A1 May 19, 2022

(30) Foreign Application Priority Data
Jan. 31, 2019 (EP) .................................... 19154727

(51) Int. Cl.
*H02H 3/087* (2006.01)
(52) U.S. Cl.
CPC .................................. *H02H 3/087* (2013.01)
(58) Field of Classification Search
CPC ............ H02H 3/087; H03K 17/08142; H03K 17/08148; H03K 17/6874; H03K 17/693
See application file for complete search history.

(56) References Cited

U.S. PATENT DOCUMENTS 9,065,326 B2 6/2015 Häfner et al.
9,802,494 B2 * 10/2017 Kühnlenz ............... B60L 50/50
(Continued)

FOREIGN PATENT DOCUMENTS

DE         10212164 A1   10/2002
DE     102014225431 A1    6/2016
(Continued)

OTHER PUBLICATIONS

PCT International Search Report and Written Opinion of International Searching Authority dated Jul. 8, 2019 corresponding to PCT International Application No. PCT/EP2019/061668 filed May 7, 2019.

*Primary Examiner* — Jared Fureman
*Assistant Examiner* — Nicolas Bellido
(74) *Attorney, Agent, or Firm* — Harness, Dickey & Pierce, P.L.C.

(57) ABSTRACT

A switching module a method for connecting a load to a DC network are disclosed. The switching module includes a first module connection, a second module connection, a third module connection, a first electronic switch connected between the first module connection and the second module connection, and a second electronic switch connected between the second module connection and the third module connection. The two electronic switches are connected in anti-series between the first module connection and the third module connection.

21 Claims, 4 Drawing Sheets

(56) References Cited

U.S. PATENT DOCUMENTS

| | | |
|---|---|---|
| 2002/0135235 A1 | 9/2002 | Winick et al. |
| 2010/0270982 A1* | 10/2010 | Hausman, Jr. ......... H01H 47/22 |
| | | 320/166 |
| 2016/0167533 A1 | 6/2016 | Kühnlenz et al. |
| 2016/0365854 A1 | 12/2016 | Hengl et al. |
| 2019/0074149 A1 | 3/2019 | Rupp |

FOREIGN PATENT DOCUMENTS

| | | | |
|---|---|---|---|
| DE | 102016204400 A1 | 9/2017 | |
| EP | 590167 A1 * | 4/1994 | ....... H03K 17/08142 |
| EP | 2814157 A2 | 12/2014 | |
| WO | WO-2014139559 A1 * | 9/2014 | ....... H03K 17/08148 |
| WO | WO-2016091281 A1 * | 6/2016 | |

\* cited by examiner

CONNECTING A LOAD TO A DIRECT CURRENT NETWORK

PRIORITY STATEMENT

This application is the national phase under 35 U.S.C. § 371 of PCT International Application No. PCT/EP2019/061668 which has an International filing date of May 7, 2019, which claims priority to EP application EP19154727.2 filed Jan. 31, 2019, the entire contents of each of which are hereby incorporated herein by reference.

FIELD

Embodiments of the present application generally relate to a switching module and to a method for connecting a load to a DC network.

BACKGROUND

In a DC network, a distinction may be made between two types of loads connected to the DC network. Firstly, there are loads of a first type in which an electric current always flows in the same current direction through a connecting line between the DC network and the load. Such loads are for example pure consumers to which energy is supplied by the DC network. Secondly, there are loads of a second type in which an electric current is able to flow in both current directions through a connecting line between the DC network and the load. Such loads may be supplied with energy from the DC network and output energy to the DC network. One example of a load of the second type is a rotating electric machine, which may be operated or act both as electric motor and as generator. While loads of the first type have to be protected against overcurrents only in one current direction, loads of the second type have to be protected against overcurrents in both current directions. It is often necessary to be able to disconnect overcurrents that are caused for example by overloads or short circuits very quickly in order to avoid or to reduce damage. Electronic switches are usually used for this purpose.

SUMMARY

In the embodiments of the invention, a device and a method make it possible to suitably protect connections of loads of both abovementioned types to a DC network against overcurrents.

Embodiments of the invention are directed to a switching module, a method and a DC network.

Advantageous refinements of the embodiments are the subject matter of the claims.

A switching module according to at least one embodiment of the invention is for connecting a load to a DC network comprises a first module connection, a second module connection, a third module connection, a first electronic switch and a second electronic switch. The first electronic switch is connected between the first module connection and the second module connection. The second electronic switch is connected between the second module connection and the third module connection. Furthermore, the two electronic switches are connected in anti-series, that is to say with mutually opposing forward directions, between the first module connection and the third module connection. The term "load" here and hereinbelow also encompasses a load zone containing multiple devices.

In the method according to at least one embodiment of the invention for connecting a load to a DC network by way of a switching module according to an embodiment of the invention, if bidirectional overcurrent protection against overcurrents in both current directions is required between the load and the DC network, a network line of the DC network is connected to the first module connection of the switching module and a load line of the load is connected to the third module connection of the switching module. If, on the other hand, only unidirectional overcurrent protection against overcurrents in one current direction is required between the load and the DC network, a network line of the DC network is connected to the first module connection and/or the third module connection of the switching module and a load line of the load is connected to the second module connection of the switching module.

BRIEF DESCRIPTION OF THE DRAWINGS

The above-described properties, features and advantages of this invention and the manner in which they are achieved become more clearly and distinctly comprehensible in connection with the following description of example embodiments which are explained in more detail in connection with the drawings. In the figures.

Figure 1:
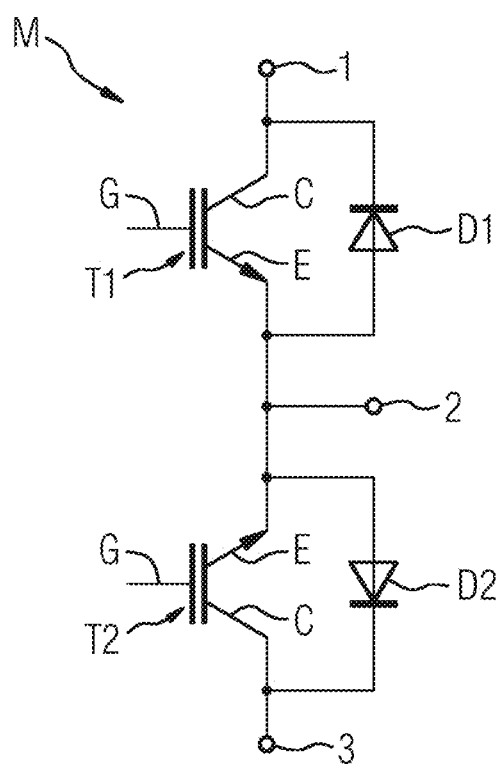
FIG. 1 shows a circuit diagram of a first example embodiment of a switching module according to the invention.

In the figures, parts corresponding to one another have been provided with the same reference signs.

DETAILED DESCRIPTION OF EXAMPLE EMBODIMENTS

A switching module according to at least one embodiment of the invention is for connecting a load to a DC network comprises a first module connection, a second module connection, a third module connection, a first electronic switch and a second electronic switch. The first electronic switch is connected between the first module connection and the second module connection. The second electronic switch is connected between the second module connection and the third module connection. Furthermore, the two electronic switches are connected in anti-series, that is to say with mutually opposing forward directions, between the first module connection and the third module connection. The term "load" here and hereinbelow also encompasses a load zone containing multiple devices.

A switching module according to at least one embodiment of the invention makes it possible to connect a load to a DC network in different ways depending on whether bidirectional overcurrent protection against overcurrents in both current directions or only unidirectional overcurrent protection against overcurrents in one current direction is required between the load and the DC network.

The switching module of at least one embodiment has the first module connection and the third module connection for bidirectional overcurrent protection. The anti-series interconnection of the two electronic switches between these two module connections allows overcurrent protection in both current directions through opening of the electronic switch, the forward direction of which corresponds to the respective current direction of the overcurrent. A load to be protected bidirectionally against overcurrents is therefore connected to the DC network via the first module connection and the third module connection, wherein for example the first module connection is connected to the DC network and the third module connection is connected to the load.

The switching module of at least one embodiment has the second module connection for unidirectional overcurrent protection, this being connected to the first module connection via the first electronic switch and to the third module connection via the second electronic switch. This makes it possible to connect a load to be protected only unidirectionally against overcurrents, for example, to the DC network via the second module connection as load-side connection and via the first or the third module connection as network-side connection. As a result, the current only has to flow between the load and the DC network via one of the two electronic switches, as a result of which the losses are advantageously halved in comparison with current conduction through both series-connected switches. Furthermore, the first module connection and the third module connection may also be interconnected and connected to the DC network, while the second module connection is connected to the load. The two electronic switches are then connected in parallel and the losses are reduced again.

In one refinement of an embodiment of the invention, each electronic switch is an insulated-gate bipolar transistor (IGBT) that has a collector connection, an emitter connection and a gate connection. By way of example, the collector connection of the first electronic switch is in this case connected to the first module connection, the collector connection of the second electronic switch is connected to the third module connection, and the emitter connections of the electronic switches are connected to one another and each to the second module connection. As an alternative, the emitter connection of the first electronic switch is connected to the first module connection, the emitter connection of the second electronic switch is connected to the third module connection, and the collector connections of the electronic switches are connected to one another and each to the second module connection. The circuit variant in which the emitter connections of the electronic switches are connected to one another and each to the second module connection has the advantage that the same control voltage may be used for both gate connections, and a gate driver may therefore be eschewed. The circuit variant in which the collector connections of the electronic switches are connected to one another and each to the second module connection has the advantage of greater stability with respect to line-commutated electromagnetic interference. The predominant advantage and the circuit variant that is therefore preferably used depends on the specific application.

In another refinement of an embodiment of the invention, each electronic switch is a metal-oxide-semiconductor field-effect transistor (MOSFET) having a drain connection, a source connection and a gate connection. By way of example, the drain connection of the first electronic switch is in this case connected to the first module connection, the drain connection of the second electronic switch is connected to the third module connection, and the source connections of the electronic switches are connected to one another and each to the second module connection. As an alternative, the source connection of the first electronic switch is connected to the first module connection, the source connection of the second electronic switch is connected to the third module connection, and the drain connections of the electronic switches are connected to one another and each to the second module connection. The abovementioned circuit variants correspond to those mentioned above if the electronic switches are IGBTs, wherein the drain connection of a MOSFET takes on the role of the collector connection of the corresponding IGBT and the source connection of the MOSFET takes on the role of the emitter connection of the IGBT.

In a further refinement of an embodiment of the invention, a diode is connected in anti-parallel with each electronic switch. In the case of an electronic switch designed as an IGBT, for example, this enables current to be conducted through the diode in the reverse direction of the IGBT. In the case of an electronic switch designed as a MOSFET, a diode connected in anti-parallel with the MOSFET may also be advantageous, for example if a forward voltage at the inverse diode of the MOSFET becomes too high.

In a further refinement of an embodiment of the invention, the switching module has connection designations for the module connections that identify the first module connection as a unidirectional and bidirectional input connection, the second module connection as a unidirectional output connection and the third module connection as a unidirectional input connection and bidirectional output connection. These connection designations advantageously facilitate wiring of the switching module that is adapted to the respectively desired overcurrent protection (bidirectional or unidirectional) and reduce the risk of incorrect or unfavorable wiring.

In a further refinement of an embodiment of the invention, the first module connection and the third module connection may be connected to one another via a switch. This simplifies the abovementioned advantageous parallel connection of the two electronic switches in the case of a load to be protected only unidirectionally from overcurrent, since this parallel connection is possible by closing the switch.

In the method according to at least one embodiment of the invention for connecting a load to a DC network by way of a switching module according to an embodiment of the invention, if bidirectional overcurrent protection against overcurrents in both current directions is required between the load and the DC network, a network line of the DC network is connected to the first module connection of the switching module and a load line of the load is connected to the third module connection of the switching module. If, on the other hand, only unidirectional overcurrent protection against overcurrents in one current direction is required between the load and the DC network, a network line of the DC network is connected to the first module connection and/or the third module connection of the switching module and a load line of the load is connected to the second module connection of the switching module.

The advantages of the method according to an embodiment of the invention correspond to the advantages, already mentioned above, of a switching module according to an embodiment of the invention.

FIG. 1 shows a circuit diagram of a first example embodiment of a switching module M according to the invention. The switching module M comprises a first module connection 1, a second module connection 2, a third module connection 3, a first electronic switch T1, a second electronic switch T2, a first diode D1 and a second diode D2.

Each electronic switch T1, T2 is an IGBT having a collector connection C, an emitter connection E and a gate connection G.

The collector connection C of the first electronic switch T1 is connected to the first module connection 1. The collector connection C of the second electronic switch T2 is connected to the third module connection 3. The emitter connections E of the electronic switches T1, T2 are connected to one another and each to the second module connection 2. The first electronic switch T1 is thus connected between the first module connection 1 and the second module connection 2, the second electronic switch T2 is connected between the second module connection 2 and the third module connection 3, and the two electronic switches T1, T2 are connected in anti-series between the first module connection 1 and the third module connection 3.

The cathode of the first diode D1 is connected to the collector connection C of the first electronic switch T1. The anode of the first diode D1 is connected to the emitter connection E of the first electronic switch T1. The first diode D1 is thereby connected in anti-parallel with the first electronic switch T1.

The cathode of the second diode D2 is connected to the collector connection C of the second electronic switch T2. The anode of the second diode D2 is connected to the emitter connection E of the second electronic switch T2. The second diode D2 is thereby connected in anti-parallel with the second electronic switch T2.

Figure 2:
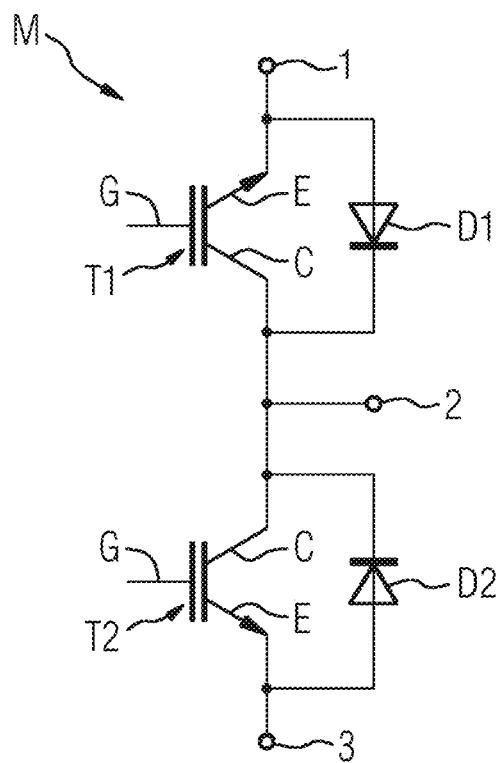
FIG. 2 shows a circuit diagram of a second example embodiment of a switching module according to the invention.

FIG. 2 shows a circuit diagram of a second example embodiment of a switching module M according to an embodiment of the invention. This example embodiment differs from the first example embodiment illustrated in FIG. 1 only in that the interconnections of the collector connections C and of the emitter connections E of the electronic switches T1, T2 are swapped in relation to the first example embodiment: the emitter connection E of the first electronic switch T1 is connected to the first module connection 1, the emitter connection E of the second electronic switch T2 is connected to the third module connection 3, and the collector connections C of the electronic switches T1, T2 are connected to one another and each to the second module connection 2. Again, the first diode D1 is connected in anti-parallel with the first electronic switch T1 and the second diode D2 is connected in anti-parallel with the second electronic switch T2.

Figure 3:
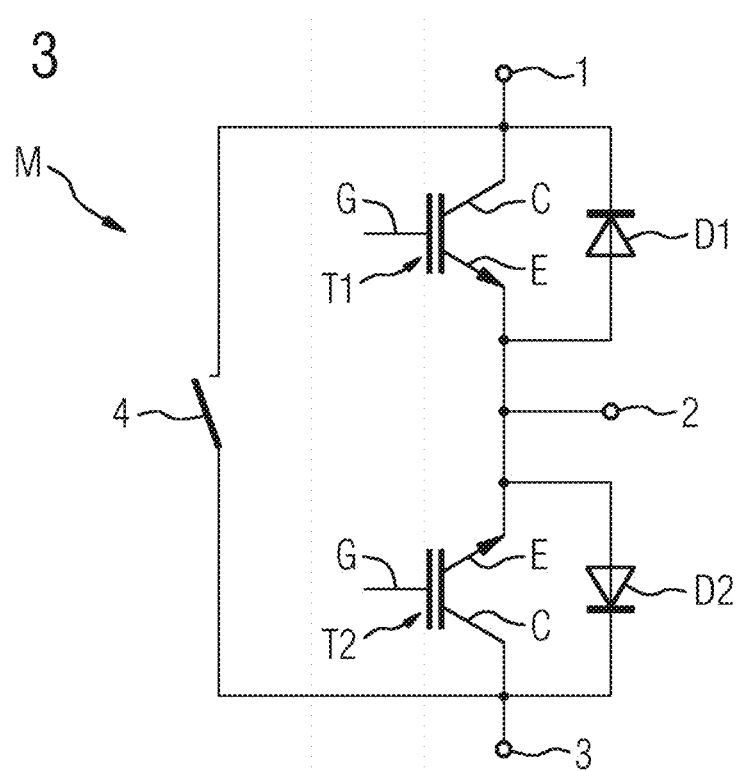
FIG. 3 shows a circuit diagram of a third example embodiment of a switching module according to the invention.

FIG. 3 shows a circuit diagram of a third example embodiment of a switching module M according to the invention. This example embodiment differs from the first example embodiment illustrated in FIG. 1 only through an additional switch 4 that is connected between the first module connection and the third module connection 3, such that the first module connection 1 and the third module connection 3 are able to be connected to one another by closing the switch 4. The two electronic switches T1, T2 may thereby be connected in parallel with one another between the first module connection or the third module connection 3 and the second module connection 2 by closing the switch 4.

Figure 4:
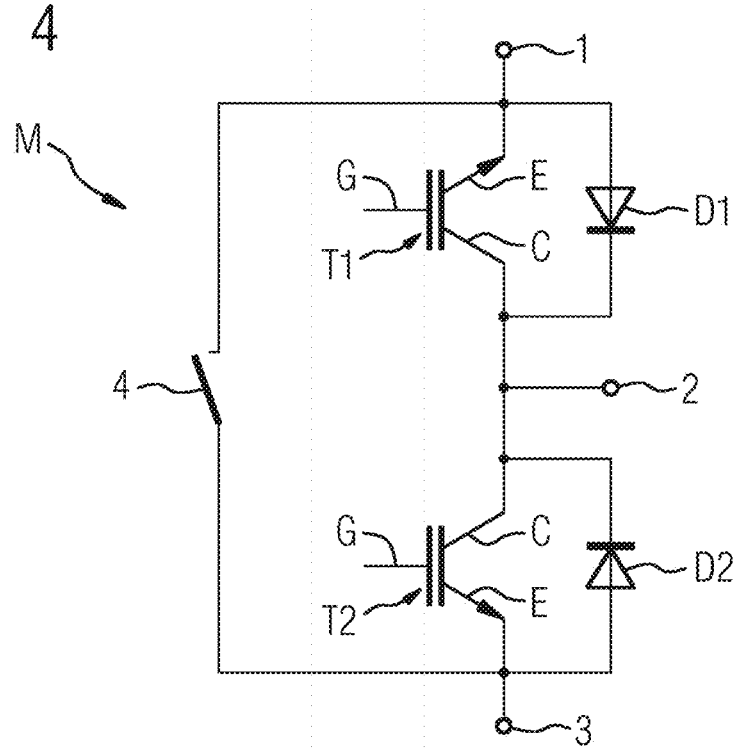
FIG. 4 shows a circuit diagram of a fourth example embodiment of a switching module according to the invention.

FIG. 4 shows a circuit diagram of a fourth example embodiment of a switching module M according to the invention. This example embodiment differs from the second example embodiment illustrated in FIG. 2 only through an additional switch 4 that is connected between the first module connection and the third module connection 3, such that the first module connection 1 and the third module connection 3 are able to be connected to one another by closing the switch 4, in the same way as in FIG. 3.

Figure 5:
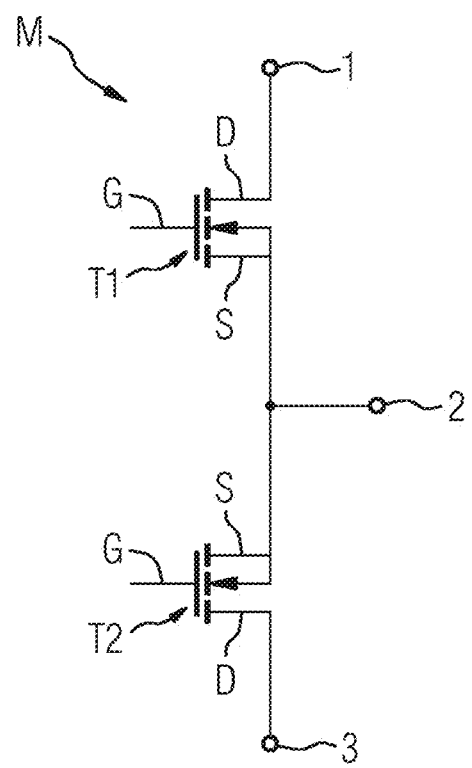
FIG. 5 shows a circuit diagram of a fifth example embodiment of a switching module according to the invention, FIG. 6 schematically shows a load connected to a DC network for bidirectional overcurrent protection via a switching module, FIG. 7 schematically shows a load connected to a DC network for unidirectional overcurrent protection via a switching module.

FIG. 5 shows a circuit diagram of a fifth example embodiment of a switching module M according to the invention. This example embodiment differs from the first example embodiment illustrated in FIG. 1 essentially in that each electronic switch T1, T2 is a MOSFET having a drain connection D, a source connection S and a gate connection G, wherein the drain connection D takes on the role of the collector connection C of the corresponding IGBT in FIG. 1 and the source connection S takes on the role of the emitter connection E of the IGBT. The switching module M shown in FIG. 5 furthermore does not have any diodes D1, D2, or the function of the diodes D1, D2 shown in FIG. 1 is taken on, in the example embodiment shown in FIG. 5, by the (intrinsic) inverse diodes of the electronic switches T1, T2 designed as MOSFETs. If necessary, in particular if forward voltages at the inverse diodes become too high, the example embodiment shown in FIG. 5 may however be modified in the same way as the example embodiment shown in FIG. 1 by connecting a diode D1, D2 in anti-parallel with each electronic switch T1, T2.

In the same way as the modification of the example embodiment shown in FIG. 1 to form the example embodiment shown in FIG. 5, the example embodiments shown in FIGS. 2 to 4 may also be modified by replacing in each case each electronic switch T1, T2 designed as an IGBT with an electronic switch T1, T2 designed as a MOSFET, without or with a diode D1, D2 connected in anti-parallel therewith, wherein the drain connection D of the MOSFET is connected in the same way as the collector connection C of the IGBT and the source connection S of the MOSFET is connected in the same way as the emitter connection E of the IGBT.

Accordingly, the example embodiments shown in FIGS. 1 to 4 may each be modified to form further example embodiments by replacing each electronic switch T1, T2 designed as an IGBT with a semiconductor switch other than a MOSFET.

The switching modules M shown in FIGS. 1 and 5 and their above-described modifications are designed to connect a load L to a DC network N and to protect the connection against overcurrents by, in the event of an overcurrent, opening the respective electronic switch T1, T2 through which the overcurrent flows. To this end, the module connections 1, 2, 3 are each routed out of the switching module M.

Figure 6:
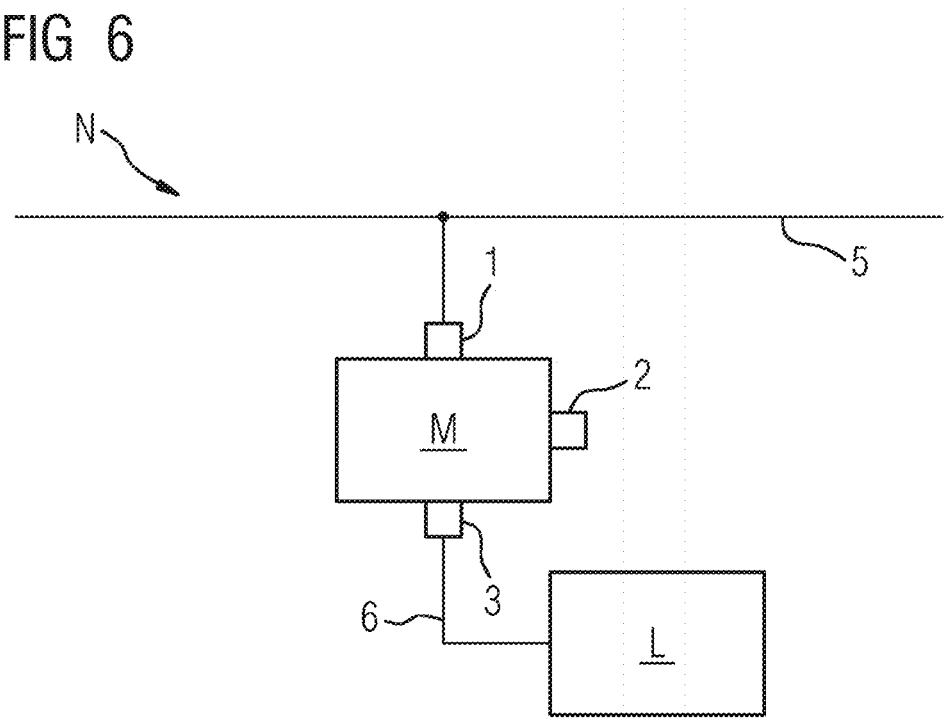

FIG. 6 schematically shows the case of bidirectional overcurrent protection against overcurrents in both current directions being required between the load L and the DC network N. In this case, in all of the example embodiments of the switching module M, a network line 5 of the DC network N is connected to the first module connection 1 of the switching module M, and a load line 6 of the load L is connected to the third module connection 3 of the switching module M.

Figure 7:
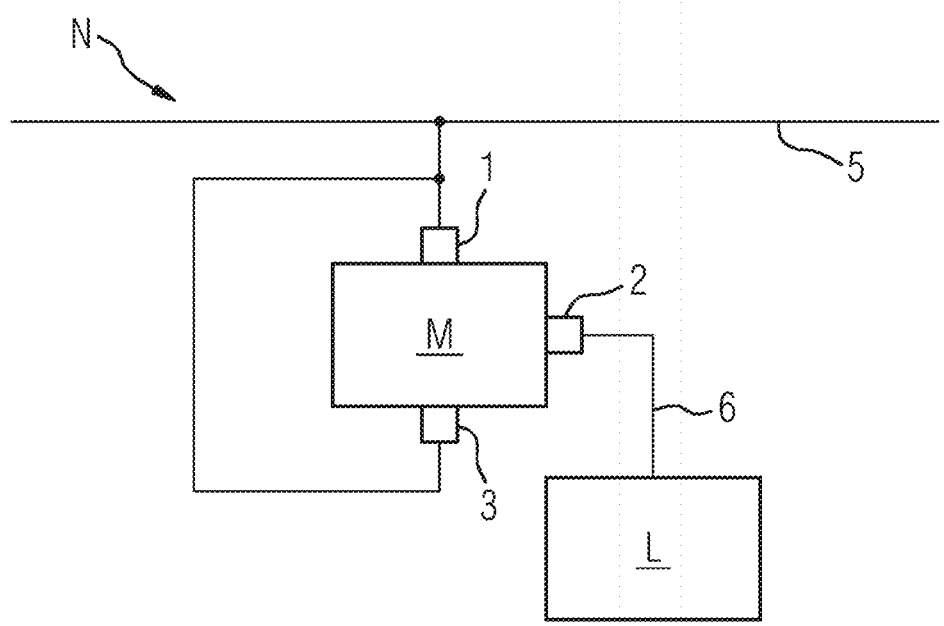

FIG. 7 schematically shows the case of only unidirectional overcurrent protection against overcurrents in one current direction being required between the load L and the DC network N. In this case, the load line 6 of the load L is connected to the second module connection 2 of the switching module M and the network line 5 of the DC network N is connected to the first module connection 1 and the third module connection 3. As an alternative, the network line 5 of the DC network N may in this case also be connected only to the first module connection 1 or the third module connection 3. In the case of the example embodiments shown in FIGS. 3 and 4, the switch 4 may in this case be closed.

The switching module M preferably has respective connection designations for the module connections 1, 2, 3 that identify the first module connection 1 as a unidirectional and bidirectional input connection, the second module connection 2 as a unidirectional output connection and the third module connection 3 as a unidirectional input connection and bidirectional output connection.

Although the invention has been illustrated and described in more detail by preferred example embodiments, the invention is not restricted by the disclosed examples and other variations may be derived therefrom by a person skilled in the art without departing from the scope of protection of the invention.

The invention claimed is:

1. A method for connecting a load to a DC network by way of a switching module, the switching module including a first module connection, a second module connection, and a third module connection;
   a first electronic switch being connected between the first module connection and the second module connection; and
   a second electronic switch being connected between the second module connection and the third module connection, the method comprising:
      connecting the first electronic switch and the second electronic switch in the anti-series between the first module connection and the third module connection;
      connecting a network line of the DC network, upon bidirectional overcurrent protection against overcurrents in both current directions being required between the load and the DC network, to the first module connection of the switching module and a load line of the load, to the third module connection of the switching module, the second module connection remaining disconnected; and
      connecting the network line of the DC network, upon unidirectional overcurrent protection against overcurrents in one current direction being required between the load and the DC network, to the first module connection, and connecting the load line of the load to the second module connection of the switching module, the third module connection remaining disconnected or being connected to the network line of the DC network.

2. A switching module for connecting a load to a DC network, the switching module comprising:
   a first module connection;
   a second module connection;
   a third module connection;
   a first electronic switch, connected between the first module connection and the second module connection; and
   a second electronic switch, connected between the second module connection and the third module connection,
   the two electronic switches being connected in anti-series between the first module connection and the third module connection; and
   wherein the switching module is configured to implement at least the following
      connecting the first electronic switch and the second electronic switch in anti-series between the first module connection and the third module connection;
      connecting a network line of the DC network, upon bidirectional overcurrent protection against overcurrents in both current directions being required between the load and the DC network, to the first module connection of the switching module and a load line of the load, to the third module connection of the switching module, the second module connection remaining disconnected; and
      connecting the network line of the DC network, upon unidirectional overcurrent protection against overcurrents in one current direction being required between the load and the DC network, to the first module connection, and connecting the load line of the load to the second module connection of the switching module, the third module connection remaining disconnected or being connected to the network line of the DC network.

3. The switching module of claim 2, wherein each of the first electronic switch and the second electronic switch is an insulated-gate bipolar transistor including a collector connection, an emitter connection and a gate connection.

4. The switching module of claim 3, wherein the collector connection of the first electronic switch is connected to the first module connection, the collector connection of the second electronic switch is connected to the third module connection and the emitter connections of the first electronic switch and the second electronic switch are connected to one another and to the second module connection.

5. The switching module of claim 3, wherein the emitter connection of the first electronic switch is connected to the first module connection, the emitter connection of the second electronic switch is connected to the third module connection and the collector connections of the first electronic switch and the second electronic switch are connected to one another and to the second module connection.

6. The switching module of claim 3, wherein a diode is connected in anti-parallel with each of first electronic switch and the second electronic switch.

7. The switching module of claim 3, further comprising:
   connection designations for the first module connection, the second module connection and the third module connection that identify
   the first module connection as a unidirectional and bidirectional input connection,
   the second module connection as a unidirectional output connection and
   the third module connection as a unidirectional input connection and bidirectional output connection.

8. The switching module of claim 3, further comprising:
   a switch, the first module connection and the third module connection being connected via the switch.

9. A DC network comprising:
   the switching module of claim 3.

10. The switching module of claim 2, wherein each of the first electronic switch and the second electronic switch is a metal-oxide-semiconductor field-effect transistor including a drain connection, a source connection and a gate connection.

11. The switching module of claim 10, wherein the drain connection of the first electronic switch is connected to the first module connection, the drain connection of the second electronic switch is connected to the third module connection and the source connections of the first electronic switch and the second electronic switch are connected to one another and to the second module connection.

12. The switching module of claim 10, wherein the source connection of the first electronic switch is connected to the first module connection, the source connection of the second electronic switch is connected to the third module connection and the drain connections of the first electronic switch and the second electronic switch are connected to one another and to the second module connection.

13. The switching module of claim 10, wherein a diode is connected in anti-parallel with each of first electronic switch and the second electronic switch.

14. The switching module of claim 10, further comprising:
connection designations for the first module connection, the second module connection and the third module connection that identify
the first module connection as a unidirectional and bidirectional input connection,
the second module connection as a unidirectional output connection and
the third module connection as a unidirectional input connection and bidirectional output connection.

15. The switching module of claim 10, further comprising:
a switch, the first module connection and the third module connection being connected via the switch.

16. A DC network comprising:
the switching module of claim 10.

17. A DC network comprising:
the switching module of claim 2.

18. The switching module of claim 2, wherein a diode is connected in anti-parallel with each of first electronic switch and the second electronic switch.

19. The switching module of claim 2, further comprising:
connection designations for the first module connection, the second module connection and the third module connection that identify
the first module connection as a unidirectional and bidirectional input connection,
the second module connection as a unidirectional output connection and
the third module connection as a unidirectional input connection and bidirectional output connection.

20. The switching module of claim 2, further comprising:
a switch, the first module connection and the third module connection being connected via the switch.

21. A method for using a switching module to provide suitable for bidirectional overcurrent protection between a load and a DC network, the switching module including a first module connection and a third module connection; a first electronic switch; and a second electronic switch, the first electronic switch and the second electronic switch being connected in anti-series between the first module connection and the third module connection, the method comprising:
providing unidirectional overcurrent protection between the load and the DC network by
connecting the first module connection a network line of the DC network, a second module connection being provided at a connection point of the first electronic switch and the second electronic switch, and a load line of the load being connected to the connection point,
the third module connection remaining disconnected or being connected to the network line of the DC network.

* * * * *